United States Patent
Navarro et al.

(10) Patent No.: US 10,011,675 B2
(45) Date of Patent: Jul. 3, 2018

(54) PROCESS FOR THE NANOSTRUCTURING OF A BLOCK COPOLYMER FILM USING A NONSTRUCTURED BLOCK COPOLYMER BASED ON STYRENE AND ON METHYL METHACRYLATE, AND NANOSTRUCTURED BLOCK COPOLYMER FILM

(71) Applicant: Arkema France, Colombes (FR)

(72) Inventors: Christophe Navarro, Bayonne (FR); Celia Nicolet, Talence (FR); Xavier Chevalier, Grenoble (FR)

(73) Assignee: Arkema France, Colombes (FR)

( * ) Notice: Subject to any disclaimer, the term of this patent is extended or adjusted under 35 U.S.C. 154(b) by 209 days.

(21) Appl. No.: 15/105,245

(22) PCT Filed: Dec. 15, 2014

(86) PCT No.: PCT/FR2014/053329
§ 371 (c)(1),
(2) Date: Jun. 16, 2016

(87) PCT Pub. No.: WO2015/092241
PCT Pub. Date: Jun. 25, 2015

(65) Prior Publication Data
US 2017/0002127 A1 Jan. 5, 2017

(30) Foreign Application Priority Data
Dec. 17, 2013 (FR) ..................... 13 62735

(51) Int. Cl.
*C08F 297/02* (2006.01)
*B82Y 30/00* (2011.01)
(Continued)

(52) U.S. Cl.
CPC .......... *C08F 297/026* (2013.01); *B82Y 30/00* (2013.01); *B82Y 40/00* (2013.01);
(Continued)

(58) Field of Classification Search
CPC ..... C08F 297/026; B82Y 30/00; B82Y 40/00; C09D 153/00; G03F 7/0002; C08J 5/18;
(Continued)

(56) References Cited

U.S. PATENT DOCUMENTS 7,255,920 B2 * 8/2007 Everaerts .................. B32B 7/06
428/355 AC
8,193,285 B2 * 6/2012 Takahashi ........... C08F 293/005
525/242

(Continued)

FOREIGN PATENT DOCUMENTS

WO     2013019679     2/2013

OTHER PUBLICATIONS

International Search Report and Written Opinion for International Application PCT/FR2014/053329, dated Feb. 23, 2015, 7 pages.
(Continued)

*Primary Examiner* — Michael M Bernshteyn
(74) *Attorney, Agent, or Firm* — RatnerPrestia

(57) ABSTRACT

The invention relates to a block copolymer film nanostructured in nanodomains at a predetermined temperature, obtained from a basic block copolymer which is nonstructured at said predetermined temperature, and at least one block of which comprises styrene and at least another block of which comprises methyl methacrylate. The block copolymer film is useful for forming nano-lithography masks.

19 Claims, 1 Drawing Sheet

Figure 1:
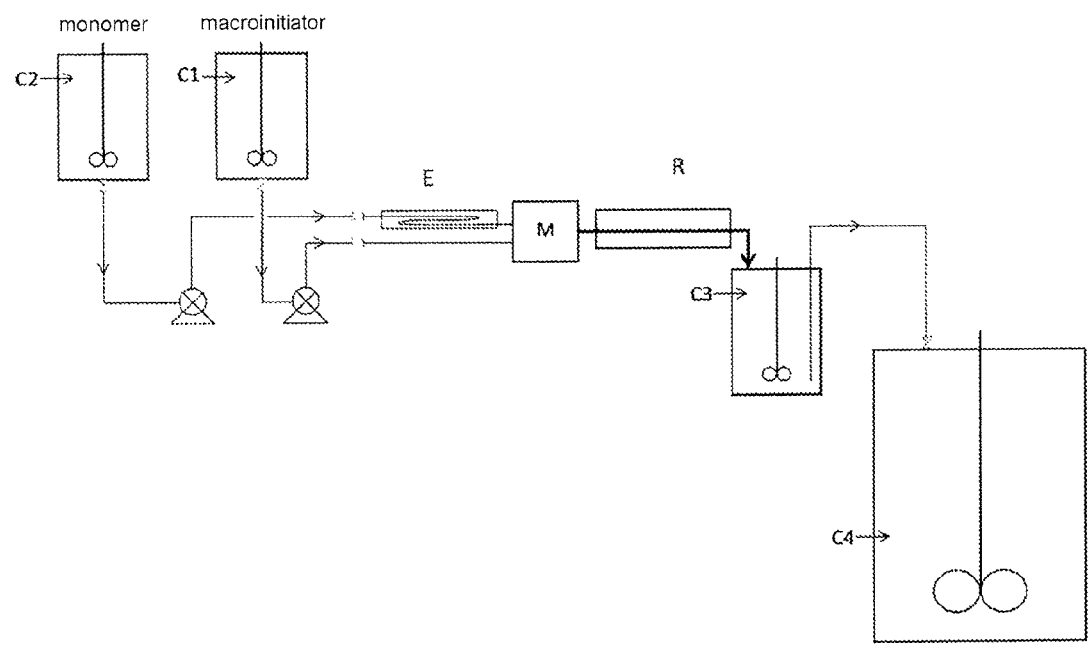

(51) Int. Cl.
*C09D 153/00* (2006.01)
*G03F 7/00* (2006.01)
*B82Y 40/00* (2011.01)
*C08J 5/18* (2006.01)

(52) U.S. Cl.
CPC .............. *C08J 5/18* (2013.01); *C09D 153/00* (2013.01); *G03F 7/0002* (2013.01); *C08J 2353/00* (2013.01); *Y10S 438/945* (2013.01); *Y10S 524/905* (2013.01); *Y10S 525/915* (2013.01)

(58) Field of Classification Search
CPC .............. C08J 2353/00; Y10S 438/945; Y10S 524/905; Y10S 525/915
USPC ........................................................ 428/522
See application file for complete search history.

(56) References Cited

U.S. PATENT DOCUMENTS

| | | |
|---|---|---|
| 8,304,493 B2 | 11/2012 | Millward |
| 8,450,418 B2 | 5/2013 | Millward |
| 2009/0253867 A1* | 10/2009 | Takahashi ........... C08F 293/005 525/227 |
| 2012/0046415 A1* | 2/2012 | Millward .............. C08F 287/00 525/105 |

OTHER PUBLICATIONS

International Preliminary Report on Patentability for International Application No. PCT/FR2014/053329, 6 pages.
Zhou et al., SAXS Anslysis of the Order—Disorder Transition and the Interaction Parameter of Polystyrene-block-poly (methyl methacrylate) Macromolecules, vol. 41, 2008, pp. 9948-9951.
Rodwogin et al., "Polylactide-Poly(dimetnylsiloxane)—Polylactide Triblock Copolymers as Multifunctional Materials for Nanolithographic Applications", ACS Nano, vol. 4, No. 2, 2010, pp. 725-732.
Takahashi et al., "Defectivity in Laterally Confined Lamella-Forming Diblock Copolymers: Thermodynamic and Kinetic Aspects", Macromolecules, vol. 45, 2012, pp. 6253-6265.
Ji et at, "Directed Assembly of Non-equilibrium ABA Triblock Copolymer Morphologies on Nanopatterned Substrates", ACS Nano, vol. 6, No. 6, 2012, pp. 5440-5448.

* cited by examiner

PROCESS FOR THE NANOSTRUCTURING OF A BLOCK COPOLYMER FILM USING A NONSTRUCTURED BLOCK COPOLYMER BASED ON STYRENE AND ON METHYL METHACRYLATE, AND NANOSTRUCTURED BLOCK COPOLYMER FILM

CROSS-REFERENCE TO RELATED APPLICATIONS

This is the national phase of International Application No. PCT/FR2014/053329, filed 15 Dec. 2014, which claims priority from French Application No. FR1362735, filed 17 Dec. 2013. The disclosure of each of these applications is incorporated herein by reference in its entirety for all purposes.

FIELD OF THE INVENTION

The present invention concerns the field of nanostructured block copolymers having nano-domains oriented in a particular direction.

More particularly, the invention relates to a styrene and methyl methacrylate block copolymer film having high phase segregation and small-size nano-domains in the order of a few nanometers. The invention further relates to a process for nanostructuring a block copolymer film from a basic block copolymer non-structured at a determined temperature.

PRIOR ART

The development of nanotechnologies has allowed the constant miniaturisation of products in the field of microelectronics and micro-electromechanical systems (MEMS) in particular. At the present time, conventional lithography techniques can no longer meet this constant need for miniaturisation, since they do not allow structures smaller than 60 nm to be produced.

It has therefore been necessary to adapt lithography techniques and to create etching masks allowing ever smaller patterns to be created with high resolution. With block copolymers it is possible to structure the arrangement of the constituent blocks of the copolymers by phase segregation between blocks thereby forming nano-domains on scales smaller than 50 nm. On account of this self-nanostructuring capability the use of block copolymers in the fields of electronics or optoelectronics is now well-known.

Among the masks researched to perform nano-lithography, films of block copolymers in particular in Polystyrene-b-Poly(methyl methacrylate), hereafter denoted PS-b-PMMA, appear to offer very promising solutions since they allow pattern creation with good resolution. To be able to use said block copolymer film as etching mask, a block of the copolymer must be selectively removed to create a porous film of the residual block the patterns of which can be subsequently transferred by etching to an underlying layer. With regard to the PS-b-PMMA film, PMMA (Poly(methyl methacrylate)), is usually removed selectively to create a residual PS mask (Polystyrene).

To create said masks the nano-domains must be oriented perpendicular to the surface of the underlying layer. Said structuring of the domains requires special conditions such as preparation of the surface of the underlying layer, but also the composition of the block copolymer.

The ratios between the blocks provide control over the shape of the nano-domains (arrangement in the form of thin strips, cylinders, spheres . . . ) and the molecular weight of each block provides control over the size and spacing of the blocks i.e. the period of the block copolymer. Another very important factor is the phase segregation factor also known as the Flory-Huggins interaction parameter and denoted "$\chi$". With this parameter it is possible to control the size of the nano-domains. More specifically it defines the tendency of the blocks of the block copolymer to separate into nano-domains. The product $\chi N$ of the degree of polymerisation N and of the Flory-Huggins parameter $\chi$ gives an indication on the compatibility of two blocks and whether or not they are able to separate. For example a diblock copolymer of strictly symmetrical composition separates into micro-domains if the product $\chi N$ is greater than 10.49. If this product $\chi N$ is less than 10.49, the blocks mix together and phase separation is not observed at observation temperature.

With the constant need for miniaturisation, it is sought to increase this degree of phase separation to produce nano-lithography masks allowing very high resolutions to be obtained, typically smaller than 20 nm, and preferably smaller than 10 nm, whilst preserving some basic properties of the block copolymer such as high glass transition temperature Tg, good temperature resistance of the block copolymer or depolymerisation of PMMA under UV treatment when the block copolymer is PS-b-PMMA, etc.

In Macromolecules, 2008, 41, 9948, Y. Zhao et al estimated the Flory-Huggins parameter for a block copolymer of PS-b-PMMA. The Flory-Huggins parameter $\chi$ obeys the following equation: $\chi = a + b/T$, where the values a and b are specific constant values dependent on the type of blocks of the copolymer and T is the temperature of the heat treatment applied to the block copolymer to allow self-organisation thereof i.e. to obtain phase separation of the domains, orientation of the domains and a reduction in the number of defects. More particularly the values a and b respectively represent entropic and enthalpic contributions. Therefore for a block copolymer of PS-b-PMMA, the phase segregation factor obeys the following equation: $\chi = -0.0282 + 4.46/T$. As a result, even if this block copolymer allows the generation of domain sizes slightly smaller than 10 nm, it does not allow much further decrease in terms of domain size on account of the low value of its Flory-Huggins interaction parameter $\chi$.

This low value of the Flory-Huggins interaction parameter therefore limits the advantage of block copolymers in PS and PMMA, for the production of structures with very high resolutions.

To bypass this problem, M. D. Rodwogin et al, ACS Nano, 2010, 4, 725, showed that it is possible to change the chemical nature of the blocks of the block copolymer to obtain a very strong increase in the Flory-Huggins parameter $\chi$ and thereby obtain a desired morphology with very high resolution i.e. the size of the nano-domains is smaller than 10 nm. These results were demonstrated in particular for a triblock copolymer of PLA-b-PDMS-b-PLA (poly(lactic acid)-block-poly(dimethylsiloxane)-block-poly(lactic acid).

H. Takahashi et al, Macromolecules, 2012, 45, 6253, examined the influence of the Flory-Huggins interaction parameter $\chi$ on the assembly kinetics of the copolymer and on defect reduction in the copolymer. In particular they showed that when this parameter $\chi$ becomes too high, in general major slowing is observed of assembly kinetics and of phase segregation kinetics also leading to slowing of defect reduction kinetics at the time of domain organisation.

A further problem reported by S. Ji et al., ACS Nano, 2012, 6, 5440, also arises when consideration is given to the organisation kinetics of block copolymers containing a plurality of blocks all differing chemically from one another. The diffusion kinetics of polymer chains and hence also the organisation and defect reduction kinetics within the self-assembled structure are dependent on segregation parameters $\chi$ between each of the different blocks. In addition, these kinetics are also slowed on account of the multi-block nature of the copolymer since the polymer chains then have lesser degrees of freedom to self-organise compared with a block copolymer comprising fewer blocks.

U.S. Pat. No. 8,304,493 and U.S. Pat. No. 8,450,418 describe a process to modify basic block copolymers having high interaction parameter $\chi$, and modified block copolymers. These block copolymers are modified to reduce the value of the Flory-Huggins interaction parameter $\chi$, so that the block copolymer is able to self-assemble into nano-domains of small size with faster kinetics. More particularly, these documents seek to reduce the Flory-Huggins parameter $\chi$ of a PS-b-PDMS block copolymer (polystyrene-block-poly(dimethylsiloxane)) having nano-domains oriented parallel to the surface in which they are deposited. The assembly kinetics of the block copolymers described in tense documents remain very slow however since they may last a few hours, typically up to 4 hours.

Document WO 2013/019679 describes the possibility of modifying at least one of the blocks of a basic block copolymer. The modification of at least one of the blocks of the block copolymer impacts the surface and interface energies of the nano-domains and involves modification of the morphology and orientation of the nano-domains in the block copolymer. This document remains silent on the organisation kinetics of the modified block copolymer and does not seek to modify the value of the interaction parameter $\chi$ to allow nano-structuring of a block copolymer non-structured at a given temperature.

Since PS-b-PMMA block copolymers already allow dimensions close to 10 nm to be obtained, the applicant has sought a solution to modify this type of block copolymer so that it self-nanostructures into nano-domains of smaller size whilst preserving its very fast organisation kinetics.

More particularly, the applicant has sought a solution to modify a said block copolymer non-structured at a given temperature via its $\chi N$ value less than 10, so as to increase the Flory-Huggins parameter $\chi$ and gain access to structuring of the nano-domains without however penalising the organisation kinetics of the blocks of the copolymer which must be rapid i.e. in the order of a few minutes.

Technical Problem

The objective of the invention is therefore to overcome at least one of the disadvantages of the prior art. In particular, the invention sets out to propose a process for nano-structuring a block copolymer film into nano-domains of size smaller than 10 nm, starting from a basic block copolymer non-structured at a determined temperature and having at least one block comprising styrene and at least another block comprising methyl methacrylate. For this purpose, the block copolymer is modified so that the product $\chi N$ is greater than or equal to 7, preferably greater than or equal to 10 to allow good phase segregation between the nano-domains and the obtaining of resolution in the order of one nanometer. The nano-structuring process must also allow very rapid organisation of the block copolymer with organisation kinetics in the order of a few minutes. Preferably, to obtain organisation kinetics in the order of a few minutes, the product $\chi N$ must be less than or equal to 500, and preferably less than or equal to 200. The invention also sets out to propose a block copolymer film nanostructured into nano-domains of size smaller than 10 nm at a determined temperature, obtained from a basic block copolymer non-structured at said determined temperature and having at least one block comprising styrene and at least one other block comprising methyl methacrylate, said copolymer being modified so that it self-nanostructures into nano-domaines with rapid organisation kinetics of the blocks.

BRIEF DESCRIPTION OF THE INVENTION

It has surprisingly been discovered that a block copolymer film nano-structured into nano-domains at a determined temperature, obtained from a basic block copolymer non-structured at said determined temperature and having at least one block comprising styrene and at least one other block comprising methyl methacrylate, said block copolymer film being characterized in that it has the following modified chemical formula:

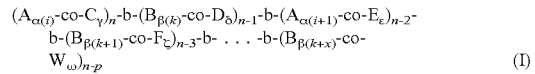
(I)

where:
"n" represents the number of blocks of the block copolymer;
"A" represents styrene and "B" represents methyl methacrylate, or conversely;
"C", "D", "E", "F", . . . , "W" respectively represent a co-monomer or mixture of co-monomers incorporated in each of the blocks of the block copolymer, the co-monomer or mixture of co-monomers incorporated in a styrene-based block differing from the co-monomer or mixture of co-monomers incorporated in a methyl methacrylate-based block;
the subscripts $\alpha i$ and $\beta k$ represent the number of units of styrene or methyl methacrylate monomers contained in each block of the block copolymer, and are all independent of one another;
the subscripts $\gamma, \delta, \varepsilon, \zeta \ldots$, and $\omega$ represent the number of units of co-monomers in a given block, and are all independent of one another;
the subscripts $\alpha i, \beta k, \gamma, \delta, \varepsilon, \zeta \ldots$, and $\omega$ all greater than or equal to 1, allows a value $\chi N$ to be obtained within the desired range and allows the obtaining of small-sized nano-domains, typically smaller than 10 nm, whilst preserving organisation and defect reduction kinetics which are suitable and of the same order of magnitude as the organisation kinetics of a basic PS-b-PMMA, block copolymer i.e. non-modified, typically in the order of a few minutes to a few tens of minutes.

The invention further relates to a process for the nano-structuring into nano-domains of a block copolymer film starting from a basic block copolymer non-structured at a determined temperature and having at least one block comprising styrene and at least one other block comprising methyl methacrylate, said process being characterized in that it comprises the following steps:
synthesis of said block copolymer by incorporating at least one co-monomer in each of the blocks of said basic block copolymer, said block copolymer then meeting following modified formula (I):

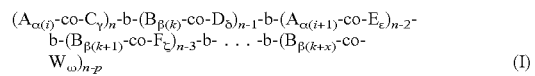
(I)

where:
"n" represents the number of blocks of the block copolymer;
"A" represents styrene and "B" represents methyl methacrylate, or conversely;
"C", "D", "E", "F", . . . , "W" respectively represent co-monomers or mixtures of co-monomers incorporated in each of the blocks of the block copolymer, the co-monomer or mixture of co-monomers incorporated in a styrene-based block differing from the co-monomer or mixture of co-monomers incorporated in the methyl methacrylate-based block;
the subscripts $\alpha i$ and $\beta k$ represent the number of units of styrene or methyl methacrylate monomers contained in each block of the block copolymer, and are all independent of one another;
the subscripts $\gamma$, $\delta$, $\varepsilon$, $\zeta$ . . . , and $\omega$ represent the number of co-monomer units in a given block and are all independent of one another;
the subscripts $\alpha i$, $\beta k$, $\gamma$, $\delta$, $\varepsilon$, $\zeta$ . . . , and $\omega$ all greater than or equal to 1;
application of a solution of said block copolymer in film form onto a surface;
evaporation of the solvent of the solution and annealing at said determined temperature.

Finally, the invention relates to a nano-lithography mask obtained from a film of said block copolymer described above, deposited on a surface to be etched following the above-described process, said copolymer film comprising nano-domains oriented perpendicular to the surface to be etched.

Figure 2:
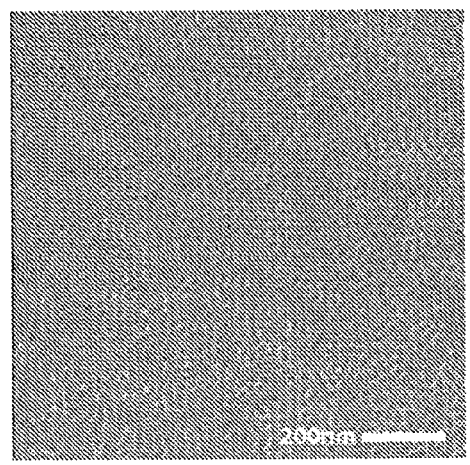

Other particular aspects and advantages of the invention will become apparent on reading the description given as an illustrative, non-limiting example with reference to the appended Figures which illustrate:

FIG. 1, a schematic of an example of polymerisation installation able to be used;

FIG. 2, a photo taken under scanning electron microscope of a sample of a film of PS-b-PMMA block copolymer modified and nano-structured according to the invention.

DETAILED DESCRIPTION OF THE INVENTION

The term "monomer" such as used relates to a molecule which can undergo polymerisation.

The term "polymerisation" such as used relates to the process to convert a monomer or mixture of monomers to a polymer.

By "copolymer block" or "block" is meant a copolymer grouping together several monomer units of several types.

By "block copolymer" is meant a polymer comprising at least two copolymer blocks such as defined above, the two copolymer blocks differing from one another and having a phase segregation parameter such that they are not miscible and separate into nano-domains.

The term "miscibility" used above means the capability of two compounds to mix together in full to form a homogeneous phase.

The principle of the invention is to modify the chemical backbone of a basic PS-b-PMMA block copolymer, whilst preserving styrene and methyl methacrylate repeat units in each block, by incorporating co-monomers at the time of the polymerisation reaction of each block. This incorporation of co-monomers in each of the blocks allows gradual modulating of the Flory-Huggins interaction parameter $\chi$ of a PS- and PMMA-based block copolymer, as a function of the magnitude of backbone modification. Therefore by means of said modification, it becomes possible to increase the product $\chi N$ so that it becomes greater than 10, to allow nano-structuring of the block copolymer to nano-domains of size smaller than 10 nm, and preferably of 1 to a few nanometers, whilst preserving very rapid organisation kinetics in the order of one to a few minutes.

For this purpose, the block copolymer meets the following chemical formula:

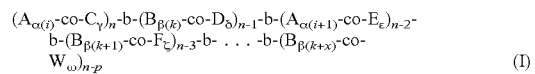

(I)

where:
"n" represents the number of blocks of the block copolymer;
"A" represents styrene and "B" represents methyl methacrylate, or conversely;
"C", "D", "E", "F" . . . "W" are the respective co-monomers incorporated in each of the blocks of the block copolymer. The co-monomer or mixture of co-monomers incorporated in a styrene block differs from the co-monomer or mixture of co-monomers incorporated in a methyl methacrylate block.

The subscripts $\alpha i$ and $\beta k$ represent the number of units of styrene or methyl methacrylate monomers contained in each block of the block copolymer and are all independent of one another. Similarly, the subscripts $\gamma$, $\delta$, $\varepsilon$, $\zeta$ . . . , and $\omega$ represent the number of co-monomer units in a given block and are also all independent of one another.

In addition all the subscripts of formula (I), representing the number of units of each monomer in the blocks, must simultaneously meet the following relationships: $\alpha(i) \geq 1$, $\alpha(i+1) \geq 1$, . . . , $\alpha(i+x) \geq 1$, $\beta(k) \geq 1$, $\beta(k+1) \geq 1$, . . . , $\beta(k+x) \geq 1$, $\gamma \geq 1$, $\delta \geq 1$, $\varepsilon \geq 1$, $\zeta \geq 1$, . . . , and $\omega \geq 1$. The fact that all these subscripts greater than or equal to 1 means that the modulation of the phase segregation parameter $\chi$ of the block copolymer can be as fine-tuned as possible. Preferably, these subscripts are all less than or equal to 5000.

The number n of blocks in the block copolymer is preferably less than or equal to 7, further preferably $2 \leq n \leq 3$.

Given the problems generated when the parameter $\chi$ of a polymer is too high, leading in particular to slowing of organisation and defect reduction kinetics, the product $\chi N$ of the modified block copolymer, meeting preceding formula (I), must be sufficiently high to obtain optimum phase segregation and nano-domains of size smaller than 10 nm, but not too high so as not to cause problems of organisation or defect reduction kinetics. In product $\chi N$, N represents the total degree of polymerisation of the block copolymer (N=$\Sigma \alpha i + \Sigma \beta k + \gamma + \delta + \varepsilon + \zeta + \ldots + \omega$). Therefore to obtain rapid organisation of the block copolymer and a nano-domain size of less than 10 nm, the product $\chi N$ must preferably lie in the following range of values: $7 \leq \chi N \leq 500$, and more preferably $10 \leq \chi N \leq 200$. On account of the physical definition of the interaction parameter $\chi = (a+b/T)$, where "a" and "b" respectively represent an entropic or enthalpic contribution and T the temperature (in degrees Kelvin), this amounts to writing that the block copolymer must preferably meet the relationship $10 \leq N(a+b/T) \leq 200$. T represents the organisation temperature of the block copolymer i.e. the anneal temperature leading to phase separation between the different blocks, orienting of the nano-domains obtained and a reduction in the number of defects. Preferably, this temperature T lies within a temperature range of $293°\text{ K} \leq T \leq 673°\text{ K}$.

In the present invention, even if the number of blocks of the block copolymer is not limited, consideration is especially given to the synthesis of tri- or diblock copolymers and preferably diblock copolymers. For a copolymer comprising an uneven number of blocks, either of the two blocks at the ends of the block copolymer can comprise the styrene or methyl methacrylate.

Said PS- and PMMA-based block copolymer having its chemical backbone modified by incorporating co-monomers in each of the blocks, allows the generating of small size patterns in the order of one nanometer to a few nanometers, preserving of the properties related to the chemistry of the basic block copolymer i.e. high glass transition temperature Tg, good temperature resistance and depolymerisation of PMMA-containing blocks under UV, etc. whilst being able to add new properties to the modified block copolymer e.g. better resistance of the mask obtained against transfer to within the substrate, improved sensitivity of one or more blocks to a given radiation, luminescence properties or electron/hole transport properties . . . .

The block copolymer therefore comprises at least one copolymer block formed of a styrene monomer and of one or more other co-monomers differing from styrene, and at least one other copolymer block formed of a monomer of methyl methacrylate MMA and of one or more other co-monomers differing from methyl methacrylate. The co-monomers of each of the blocks may have an arrangement of statistical or gradient type.

The synthesis of block copolymers may be sequential synthesis. In this case, whether polymerisation is radical, cationic or anionic, first a first block is synthesized with a first mixture of monomers, then at a second stage the monomers of the other blocks are incorporated. With radical polymerisation, it is possible to obtain a block copolymer by incorporating all the monomers concomitantly batch-wise or continuously, provided heed is given to reactivity ratios that are sufficiently high between each monomer.

In the modified block copolymer meeting formula (I), the sequencing of the different copolymer blocks can adopt either a linear structure via synthesis performed sequentially for example, or a star-shaped structure when synthesis is performed using a multi-functional initiator for example. The obtaining of this modified block copolymer can also be envisaged by grafting together different pre-synthesized blocks via the reactive ends.

The copolymerisation reaction of each block can be conducted using usual techniques i.e. controlled radical polymerisation, anionic polymerisation or polymerisation via ring-opening etc. In addition, it is possible to envisage the copolymerisation of a given copolymer block using a given technique whilst the copolymerisation of another copolymer block is conducted using another technique. When the copolymer blocks are not polymerisable using the same polymerisation technique, two cases can be envisaged. In the first case a first functionalised block is synthesized which under the action of an initiator can initiate the polymerisation of a second block. In the second case, each functionalised block is synthesized separately using a suitable polymerisation technique, the functions at the end of their chains then reacting together to join the blocks together.

The symbols "C", "D", "E", "F" . . . "W" can each represent either pure chemical entities i.e. a single chemical compound co-polymerised per block, or can represent a group of co-monomers in a given block. In this case, the copolymer block, (Aα(i)-co-Cγ)n for example, defines either styrene or methyl methacrylate as entity "A", co-polymerised with "C", where "C" is either a single co-monomer or a group of co-monomers of any number.

The co-monomers can be selected from a usual list of co-monomers so that the χN of the block copolymer obtained lies within the desired range. Calculation charts can be used to determine the relationship between the composition and χN, to modify the composition and content of incorporated co-monomer in each block.

When the polymerisation process is conducted via controlled radical route, any controlled radical polymerisation technique can be used whether NMP (Nitroxide Mediated Polymerization), RAFT (Reversible Addition and Fragmentation Transfer), ATRP (Atom Transfer Radical Polymerization), INIFERTER (Initiator-Transfer-Termination), RITP (Reverse Iodine Transfer Polymerization), ITP (Iodine Transfer Polymerization). Preferably the polymerization process via controlled radical route is performed using NMP.

More particularly the nitroxides from alkoxyamines derived from the stable free radical (1) are preferred.

(1)

wherein the radical $R_L$ has a molar mass greater than 15.0342 g/mole. The radical $R_L$ may be a halogen atom such as chlorine, bromine or iodine, a saturated or unsaturated cyclic, branched or straight-chain hydrocarbon group such as an alkyl or phenyl radical, or an ester group —COOR or alkoxyl group —OR, or phosphonate group —PO(OR)$_2$, provided it has a molar mass greater than 15.0342. The monovalent radical $R_L$ is said to be at position β relative to the nitrogen atom of the nitroxide radical. The remaining valences of the carbon atom and of the nitrogen atom in formula (1) can be linked to various radicals such as a hydrogen atom, a hydrocarbon radical e.g. an alkyl, aryl or aryl-alkyl radical having 1 to 10 carbon atoms. It is not excluded that the carbon atom and the nitrogen atom in formula (1) are linked together via a bivalent radical to form a ring. Preferably however, the remaining valences of the carbon atom and nitrogen atom of formula (1) are linked to monovalent radicals. Preferably, the radical $R_L$ has a molar mass greater than 30 g/mole. The radical $R_L$ may for example have a molar mass between 40 and 450 g/mole. As an example, the radical $R_L$ may be a radical comprising a phosphoryl group, said radical $R_L$ able to be represented by the formula:

(2)

wherein $R^3$ and $R^4$, the same or different, can be selected from among alkyl, cycloalkyl, alkoxyl, aryloxyl, aryl, aralkyloxyl, perfluoroalkyl, aralkyl radicals, and may have 1 to 20 carbon atoms. $R^3$ and/or $R^4$ may also be a halogen atom e.g. a chlorine, bromine, fluorine or iodine atom. The radical $R_L$ may also comprise at least one aromatic ring as for the phenyl radical or naphthyl radical, possibly being substituted for example by an alkyl radical having 1 to 4 carbon atoms.

More particularly, the alkoxyamines derived from the following stable radicals are preferred:
N-tertiobutyl-1-phenyl-2 methyl propyl nitroxide,
N-tertiobutyl-1-(2-naphtyl)-2-methyl propyl nitroxide,
N-tertiobutyl-1-diethylphosphono-2,2-dimethyl propyl nitroxide,
N-tertiobutyl-1-dibenzylphosphono-2,2-dimethyl propyl nitroxide,
N-phenyl-1-diethyl phosphono-2,2-dimethyl propyl nitroxide,
N-phenyl-1-diethyl phosphono-1-methyl ethyl nitroxide,
N-(1-phenyl 2-methyl propyl)-1-diethylphosphono-1-methyl ethyl nitroxide,
4-oxo-2,2,6,6-tetramethyl-1-piperidinyloxy,
2,4,6-tri-tert-butylphenoxy.

Preferably, the alkoxyamines derived from N-tertiobutyl-1-diethylphosphono-2,2-dimethyl-propyl nitroxide are used.

The co-monomer(s) incorporated in a styrene block advantageously differ from the co-monomer(s) incorporated in another block that is methyl methacrylate-based.

The constituent co-monomers of each of the copolymer blocks containing styrene and methyl methacrylate respectively are selected from among the following monomers: vinyl, vinylidene, diene, olefin, allyl, (meth)acrylic or cyclic monomers. These monomers are more particularly selected from among the vinylaromatic monomers such as styrene or substituted styrenes in particular alpha-methylstyrene, acrylic monomers such as acrylic acid or salts thereof, alkyl, cycloalkyl or aryl acrylates such as methyl, ethyl, butyl, ethylhexyl or phenyl acrylate, hydroxyalkyl acrylates such as 2-hydroxyethyl acrylate, etheralkyl acrylates such as 2-methoxyethyl acrylate, alkoxy- or aryloxy-polyalkyleneglycol acrylates such as methoxypolyethyleneglycol acrylates, ethoxypolyethyleneglycol acrylates, methoxypolypropyleneglycol acrylates, methoxy-polyethyleneglycol-polypropyleneglycol acrylates or mixtures thereof, aminoalkyl acrylates such as 2-(dimethylamino)ethyl acrylate (ADAME), fluorinated acrylates, silylated acrylates, phosphated acrylates such as alkyleneglycol phosphate acrylates, glycidyl acrylates, dicyclopentenyloxyethyl acrylates, methacrylic monomers such as methacrylic acid or salts thereof, alkyl, cycloalkyl, alkenyl or aryl methacrylates such as methyl methacrylate (MAM), lauryl, cyclohexyl, allyl, phenyl or naphthyl methacrylates, hydroxyalkyl methacrylates such as 2-hydroxyethyl methacrylate or 2-hydroxypropyl methacrylate, etheralkyl methacrylates such as 2-ethoxyethyl methacrylate, alkoxy- or aryloxy-polyalkyleneglycol methacrylates such as methoxypolyethyleneglycol methacrylates, ethoxypolyethyleneglycol methacrylates, methoxypolypropyleneglycol methacrylates, methoxy-polyethyleneglycol-polypropyleneglycol methacrylates or mixtures thereof, aminoalkyl methacrylates such as 2-(dimethylamino)ethyl methacrylate (MADAME), fluorinated methacrylates such as 2,2,2-trifluoroethyl methacrylate, silylated methacrylates such as 3-methacryloylpropyltrimethylsilane, phosphated methacrylates such as alkyleneglycol phosphate methacrylates, hydroxy-ethylimidazolidone methacrylate, hydroxy-ethylimidazolidinone methacrylate, 2-(2-oxo-1-imidazolidinyl)ethyl methacrylate, acrylonitrile, acrylamide or substituted acrylamides, 4-acryloylmorpholine, N-methylolacrylamide, methacrylamide or substituted methacrylamides, N-methylolmethacrylamide, methacrylamido-propyltrimethyl ammonium chloride (MAPTAC), glycidyl-, dicyclopentenyloxyethyl methacrylates, itaconic acid, maleic acid or salts thereof, maleic anhydride, alkyl or alkoxy- or aryloxy-polyalkyleneglycol maleates or hemimaleates, vinylpyridine, vinylpyrrolidinone, (alkoxy) poly (alkylene glycol) vinyl ether or divinyl ether such as methoxy poly(ethylene glycol) vinyl ether, poly(ethylene glycol) divinyl ether, olefin monomers of which ethylene, butene, 1,1-diphenylethylene, hexene and 1-octene can be cited, diene monomers including butadiene, isoprene and fluorinated olefin monomers and vinylidene monomers among which can be mentioned vinylidene fluoride or mixtures thereof, cyclic monomers among which lactones can be cited such as e-caprolactone, lactides, glycolides, cyclic carbonates such as trimethylenecarbonate, siloxanes such as octamethylcyclotetrasiloxane, cyclic ethers such as trioxane, cyclic amides such as e-caprolactame, cyclic acetals such as 1,3-dioxolane, phosphazenes such as hexachlorocyclotriphosphazene, N-carboxyanhydrides, cyclic phosphate esters such as cyclophosphorinans, cyclophospholans, oxazolines, optionally protected for compatibility with polymerisation processes.

With controlled radical polymerisation, the residence time in the polymerisation reactor impacts the value of the Flory-Huggins parameter $\chi$ of the end block copolymer. Due to the different reactivities of the co-monomers to be incorporated in the copolymer blocks, they do not all integrate at the same rate into the chain. As a result, depending on residence time, the relative proportions of the different co-monomers in the copolymer blocks are different and hence the value of parameter $\chi$ of the final block copolymer also varies. In general, with radical polymerisation it is sought to obtain conversion rates in the order of 50-70%. Therefore a maximum residence time in the polymerisation reactor is determined corresponding to these conversion rates. For example to obtain a conversion rate of 50 to 70%, the starting ratio is modified of the co-monomers to be polymerised. For this purpose calculation charts can be used allowing determination first of the relationship between the starting ratio of the co-monomers to be polymerised and the rate of conversion, and secondly between the composition of the block copolymer and $\chi N$.

When the polymerisation process is conducted via anionic route which is the preferred route used in the invention, any anionic polymerisation mechanisms can be considered whether ligand anionic polymerisation or anionic polymerisation via ring opening.

In the invention it is preferred to use an anionic polymerisation process in an apolar solvent, and preferably toluene such as described in patent EP0749987 using a micro-mixer. In general, the co-monomers incorporated in each copolymer block must have a pKa such that it is close to that of the propagating species. More particularly the difference in pKa between the propagating species and the incorporated co-monomer must be less than or equal to 12, preferably less than or equal to 10 and further preferably less than or equal to 5.

The constituent co-monomers of the styrene copolymer block are selected from among the following monomers: vinyl, vinylidene, diene, olefin, allyl, (meth)acrylic or cyclic monomers. These monomers are more particularly selected from among vinylaromatic monomers such as styrene or substituted styrenes particularly alpha-methylstyrene, silylated styrenes, acrylic monomers such as alkyl, cycloalkyl or aryl acrylates such as methyl, ethyl, butyl, ethylhexyl or phenyl acrylates, etheralkyl acrylates such as 2-methoxyethyl acrylate, alkoxy- or aryloxy-polyalkyleneglycol acrylates such as methoxypolyethyleneglycol acrylates, ethoxypolyethyleneglycol acrylates, methoxypolypropyleneglycol acrylates, methoxy-polyethyleneglycol-polypropyleneglycol acrylates or mixtures thereof, aminoalkyl acrylates such as 2-(dimethylamino)ethyl acrylate (ADAME), fluorinated acrylates, silylated acrylates, phosphated acrylates such as alkyleneglycol phosphate acrylates, glycidyl, dicyclopentenyloxyethyl acrylates, alkyl, cycloalkyl, alkenyl or aryl methacrylates such as methyl methacrylate (MAM), lauryl, cyclohexyl, allyl, phenyl or naphthyl methacrylates, ether-alkyl methacrylates such as 2-ethoxyethyl methacrylate, alkoxy- or aryloxy-polyalkyleneglycol methacrylates such as methoxypolyethyleneglycol methacrylates, ethoxypolyethyleneglycol methacrylates, methoxypolypropyleneglycol, methoxy-polyethyleneglycol-polypropyleneglycol methacrylates or mixtures thereof, aminoalkyl methacrylates such as 2-(dimethylamino)ethyl acrylate (MADAME), fluorinated methacrylates such as 2,2,2-trifluoroethyl methacrylate, silylated methacrylates such as 3-methacryloylpropyltrimethylsilane, phosphated methacrylates such as alkyleneglycol phosphate methacrylates, hydroxyethylimidazolidone methacrylate, hydroxyethylimidazolidinone methacrylate, 2-(2-oxo-1-imidazolidinyl)ethyl methacrylate, acrylonitrile, acrylamide or substituted acrylamides, 4-acryloylmorpholine, N-methylolacrylamide, methacrylamide or substituted methacrylamides, N-methylolmethacrylamide, methacrylamido-propyltrimethyl ammonium chloride (MAPTAC), glycidyl-, dicyclopentenyloxyethyl methacrylates, itaconic acid, maleic acid or salts thereof, maleic anhydride, alkyl or alkoxy- or aryloxy-polyalkyleneglycol maleates or hemimaleates, vinylpyridine, vinylpyrrolidinone, (alkoxy) poly(alkylene glycol) vinyl ethers or divinyl ethers such as methoxy poly(ethylene glycol) vinyl ether, poly(ethylene glycol) divinyl ether, olefin monomers among which ethylene, butene, 1,1-diphenylethylene, hexene and 1-octene can be cited, diene monomers including butadiene, isoprene and fluorinated olefin monomers, and vinylidene monomers among which vinylidene fluoride can be cited, cyclic monomers those cited being lactones such as e-caprolactone, lactides, glycolides, cyclic carbonates such as trimethylenecarbonate, siloxanes such as octamethylcyclotetrasiloxane, cyclic ethers such as trioxane, cyclic amides such as e-caprolactame, cyclic acetals such as 1,3-dioxolane, phosphazenes such as hexachlorocyclotriphosphazene, N-carboxyanhydrides, cyclic phosphate esters such as cyclophosphorinans, cyclophospholans, oxazolines, optionally protected for compatibility with polymerisation processes, globular methacrylates such as isobornyl methacrylates, halogenated isobornyl methacrylates, halogenated alkyl methacrylates, naphthyl methacrylate, alone or in a mixture of at least two of the aforementioned monomers.

The constituent co-monomers of the methyl methacrylate copolymer block are selected from among the aforementioned monomers for the styrene block excluding the possibility of using the same co-monomer for the styrene block and the methyl methacrylate block.

The relative proportions in monomer units of each co-monomer or mixture of co-monomers in each copolymer block comprising styrene and methyl methacrylate respectively, are then between 1% and 99%, and preferably between 5% and 49%, limits included, in relation to the co-monomer of each block, styrene and methyl methacrylate respectively.

In addition, the co-monomers "C", "D", "E", "F" ... "W" incorporated in each block may all be chemically and/or structurally different. This means that a co-monomer "E" for example incorporated in a styrene copolymer block may be chemically identical to a co-monomer "F" incorporated in another methyl methacrylate copolymer block whilst differing structurally therefrom i.e. having a different space arrangement. For example this may be a monomer in the form of an isomer in one block and in the form of another isomer in the other block. Therefore the block copolymer may comprise for example a cis-1,4polybutadiene in the styrene copolymer block and a trans-1,4polybutadiene in the methyl methacrylate copolymer block. In another example, the monomer may be a chiral monomer and be contained in one copolymer block in the form of an enantiomer and in another copolymer block in the form of the other enantiomer. Finally the monomer added to the different copolymer blocks may lead to obtaining different tacticity in the different copolymer blocks.

All the subscripts $\alpha i$ of the block copolymer are independent of one another, as are all the $\beta k$. This means that each block can contain any number of styrene or methyl methacrylate monomers.

Similarly, the subscripts $\gamma$, $\delta$, $\epsilon$, $\zeta$ ..., and $\omega$ represent the number of units of co-monomers or group of co-monomers in a given block and are also all independent of one another. As a result e.g. for the copolymer block "(A$\alpha$(i)-co-C$\gamma$)n", the sum $\alpha i+\gamma$ is therefore equal to the degree of polymerisation of this block of the block copolymer.

The greater the number of units of incorporated co-monomer in the blocks, the more $\chi$ is subsequently modified compared to that of a PS-b-PMMA having pure blocks, since in this case it is moved increasingly closer to the $\chi$ of a block copolymer formed solely of the co-monomers.

The volume fraction of each copolymer block compared with the total volume of the block copolymer may vary individually, preferably from 5 to 95%, and more preferably from 15 to 85%.

The volume fraction of each block of the block copolymer is measured in the manner described below. Within a block copolymer in which at least one of the blocks comprises several co-monomers, it is possible via proton NMR to measure the mole fraction of each monomer within the whole copolymer, then to calculate the mass fraction using the molar mass of each monomer unit. To obtain the mass fractions of each block it is then sufficient to add the mass fractions of the constituent co-monomers of the block. The volume fraction of each block can then be determined from the mass fraction of each block and the density of the polymer forming the block. However, it is not always possible to obtain the density of polymers having co-polymerised monomers. In this case, the volume fraction of a block is determined from its mass fraction and the density of the compound having majority mass in the block.

Let us take the example of a P(S-co-DPE)-b-PMMA. It is possible to determine the mole fraction of each monomer in the whole copolymer via proton NMR, by integrating the aromatic protons of styrene and protons of the —OCH3 function of methyl methacrylate. Using the molar masses of each monomer unit (rounded up to 104 g/mol for example for styrene and 100 g/mol for methyl methacrylate) it is then possible to calculate the mass fraction of each block. Therefore, in the example, the copolymer comprises 60 weight % of styrene monomer units, 10 weight % of DPE monomer units and 30 weight % MMA monomer units. The weight percentages of styrene and DPE are then added to determine the weight percentage of the first block. In the example, the block copolymer therefore comprises 70 weight % of the $1^{st}$ block P(S-co-DPE) and 30 weight % of the $2^{nd}$ block PMMA. To determine the volume fraction of the $1^{st}$ block, the density of P(S-co-DPE) is taken to be that of PS, the majority mass compound in the block. The densities of PS and PMMA are known and given for example in the 4th Edition of the *Polymer Handbook*, (1.05 for PS and 1.19 for PMMA).

In addition, the molecular weight M of each copolymer block is preferably between 500 and 200000, limits included, and the polydispersity index PDi is preferably less than or equal to 2, and further preferably it is between 1.02 and 1.7 (limits included).

With anionic polymerisation, polarity and temperature are parameters which may impact monomer reactivity. These parameters must therefore be controlled to reach 100% monomer conversion and to obtain the relative proportions of each monomer initially incorporated, thereby controlling the value of parameter X.

Temperature and polarity of the solvent are therefore selected and determined as a function of the co-monomers to be incorporated and of the desired final value of $\chi$ for the block copolymer.

Said block copolymer having blocks with chemically modified structure via incorporation of co-monomers, can be used in various application processes such as lithography to form lithography masks in particular, in membrane production, the functionalisation and coating of surfaces, manufacture of inks and composites, nano-structuring of surfaces, fabrication of transistors, diodes, or organic memory devices for example.

The invention also concerns a nano-structuring process of a block copolymer film into nano-domains of size smaller than 10 nm starting from a basic block copolymer of PS-PMMA and non-structured at a given temperature. Said process provides control over phase segregation ($\chi$N) between the copolymer blocks of this block copolymer with modified chemical structure. For this process, after the block copolymer has been synthesized it is applied in solution to a surface to form a film. The solvent of the solution is then evaporated and the film subjected to heat treatment. This heat treatment or annealing enables the block copolymer to self-organize correctly i.e. in particular to obtain separation of phases between the nano-domains, orientation of the domains and a reduction in the number of defects. Preferably the temperature T of this heat treatment is such that $293°\,K \leq T \leq 673°\,K$. The block copolymer film obtained has ordered structuring for a given total degree of polymerisation, whereas a PS-b-PMMA film that is not chemically modified does not have any ordered structuring for the same degree of polymerisation.

Advantageously, said modified block copolymer with a value $\chi$N greater than 10 allows self-nanostructuring with organisation kinetics in the same order of magnitude as that of the basic block copolymer (PS-b-PMMA) i.e. kinetics in the order of a few minutes. Preferably, the organisation kinetics are 5 minutes or shorter, and further preferably 2 minutes or shorter.

The invention further concerns a nano-lithography mask obtained from the modified block copolymer, deposited on a surface to be etched in accordance with the nano-structuring process. The film deposited on the surface comprises nano-domains oriented perpendicular to the surface to be etched.

For lithography, the desired structuring e.g. the generation of nano-domains perpendicular to the surface, nevertheless requires the preparation of the surface on which the solution of copolymer is deposited in order to control surface energy. Among known possibilities, a statistical copolymer is deposited on the surface the monomers of which may be fully or partly identical to those used in the block copolymer that is to be deposited. A pioneering article by Mansky et al. (Science, vol 275 pages 1458-1460, 1997) gives a good description of this technology that is now well-known to the person skilled in the art.

Among preferred surfaces mention can be made of surfaces formed of silicon, the silicon having a native or thermal oxide layer, germanium, platinum, tungsten, gold, titanium nitrides, graphenes, BARCs (bottom anti reflecting coatings) or any other anti-reflecting layer used in lithography.

Once the surface is prepared, a solution of the block copolymer modified according to the invention is deposited and the solvent is evaporated using techniques known to the person skilled in the art such as those known as "spin coating", "Doctor Blade" "knife system", "slot die system" but any other technique can be used such as dry deposit i.e. without previous dissolving.

This is followed by heat treatment enabling the block copolymer to self-organise correctly i.e. in particular to obtain phase separation between the nano-domains, orientation of the domains, reduction in the number of defects. Preferably the temperature T of this heat treatment is such that $293°\,K \leq T \leq 673°\,K$, and the organisation kinetics are 5 minutes or shorter, preferably 2 minutes or shorter. This annealing step allowing nano-structuring of the block copolymer film can be performed in a solvent atmosphere or via thermal route or a combination of both these methods.

A modified block copolymer meeting formula (I) therefore allows an assembly of blocks to be obtained perpendicular to the surface on which it is deposited, with major phase segregation allowing nano-domains of small size to be obtained in the order of one nanometer to a few nanometers together with rapid organisation kinetics. Said block copolymer therefore provides better control over the lithography process with high resolution and compatible with current requirements in terms of component dimensions.

The following examples give a non-limiting illustration of the scope of the invention:

Example 1: Synthesis of a Diblock Copolymer P(styrene-co-1,1-diphenyl ethylene)-b-P(methyl methacrylate-co-methacrylate of 2-(dimethyl amino) ethyl)) (P(S-co-DPE)-b-P(MMA-co-MADAME))

The polymerisation installation used is schematically illustrated in FIG. 1. A solution of the macro-initiating system is prepared in a capacitor C1 and a solution of the monomers in capacitor C2. The flow of capacitor C2 is sent to an exchanger E to be brought to initial polymerisation temperature. Both flows are then sent to a mixer M which, in this example, is a statistical mixer as described in patent applications EP0749987, EP0749987 and EP0524054 then to the polymerisation reactor R which is a usual tubular reactor. The product is received in a capacitor C3 and then transferred to a capacitor C4 for precipitation therein.

In capacitor C1, a 27.5 weight % solution in toluene is prepared at 45° C. of block P(s-co-DPE) so that it is a macro-initiating system allowing subsequent initiation of the second block P(MMA-co-MADAME). For this preparation, under an inert nitrogen gas atmosphere, are added a toluene solution, 133 mL of 1.5 M s-butyllithium in hexane to which are added 4 kg of styrene/1,1-diphenylethylene mixture in 90:10 weight proportion. After a polymerisation time of 2 h at 45° C., the temperature of capacitor C1 is lowered to −20° C. and a solution of lithium methoxyethanolate and 72.1 g of 1,1-diphenylethylene in toluene are added to obtain a molar ratio of 1:6 between poly(styryl-co-1,1-diphenylethyl)CH$_2$C(Ph)$_2$Li and CH$_3$OCH$_2$CH$_2$OLi. The toluene solution is 23.2 weight %. This gives the macro-initiating system [poly(styryl-co-1,1-diphenylethyl)

CH$_2$C(Ph)$_2$Li]/[CH$_3$OCH$_2$CH$_2$OLi.]$_6$. These syntheses are also described in patent applications EP0749987 and EP0524054.

In capacitor C2, at −15° C. a solution is stored composed of MMA/MADAME (70:30 by weight) previously passed through an alumina molecular sieve, at 6.2 weight % in toluene.

The flow of the macro-initiating system is set at 60 kg/h. The flow of MMA/MADAME solution in capacitor C2 is sent to an exchanger for lowering of its temperature to −20° C. and the flow of MMA/MADAME solution is set at 56 kg/h. Both flows are then mixed in a statistical mixer and recovered in a capacitor C3 where the copolymer is deactivated by addition of a methanol solution.

Conversion determined by measurement of solid content is greater than 99%.

The content of capacitor C3 is then precipitated dropwise in a capacitor C4 under agitation containing heptane. The volume ratio between the content of capacitor C3 and content of capacitor C4 is 1:7. When addition of the solution in capacitor C3 is completed, agitation is discontinued and the copolymer sediments. It is then recovered by removing the supernatant and filtration.

After drying, the characteristics of the copolymer are the following:
Mn=29.1 kg/mol
Mw/Mn=1.2
Weight ratio P(S-co-DPE)/P(MMA-co MADAME)=69.8:30.2

Example 2: Process for Nano-Structuring a Modified PS-b-PMMA Block Copolymer Film A silicon substrate is cut manually into pieces 3λ3 cm, and the pieces cleaned using conventional treatment (piranha solution, oxygen plasma . . . ). A statistical copolymer of PS-r-PMMA, previously dissolved in propylene glycol monomethyl ether acetate (PGMEA) in a proportion of 2 weight % is deposited on the substrate to be functionalised by spin-coating, or using any other deposit technique known to skilled persons, so as to form a polymer film about 60 to 80 nm thick. The substrate is then annealed at 230° C. for 5 to 10 minutes to graft the polymer chains on the surface.

The substrate is then abundantly rinsed in PGMEA to remove excess non-grafted polymer chains, and the functionalised substrate is dried in a stream of nitrogen.

The modified PS-b-PMMA block polymer such as synthesized and described above is dissolved in PGMEA in a proportion of 1 to 2 weight % depending on intended film thickness, and is deposited on the surface by spin-coating to form a film of the desired thickness. For example, a 1.5 weight % solution can give a block copolymer film of having a thickness of about 45 to 50 nm when deposited on the surface using the spin-coating technique at 2000 rpm. The film formed is annealed at 160° C. for 5 minutes to allow nano-structuring of the blocks into nano-domains.

It is noted in this example that a silicon substrate was used. It is evidently possible to transpose this method, without any major change, to any other substrate of interest for electronics described in patent application n° FR 2974094.

The photograph shown in FIG. 2, obtained under scanning electron microscopy, illustrates a block copolymer film nano-structured in accordance with the process just described. This block copolymer film comprises cylindrical blocks of period 20 to 21 nm, wherein the cylinders are oriented perpendicular to the substrate. The period represents the minimum distance between 2 styrene or methyl methacrylate blocks, separated by a methyl methacrylate or styrene block and reciprocally. Therefore the block copolymer film obtained self-nanostructures rapidly over a time of 5 minutes or less, into nano-domains of size smaller than 10 nm.

The invention claimed is:

1. A block copolymer film nano-structured into nano-domains at a determined temperature, obtained from a basic block copolymer non-structured at said determined temperature and having at least one block comprising styrene and at least one other block comprising methyl methacrylate, wherein the block copolymer film has the following modified chemical formula:

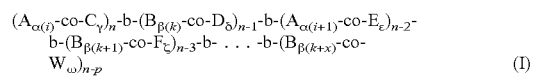

$$(A_{\alpha(i)}\text{-co-}C_\gamma)_n\text{-b-}(B_{\beta(k)}\text{-co-}D_\delta)_{n-1}\text{-b-}(A_{\alpha(i+1)}\text{-co-}E_\varepsilon)_{n-2}\text{-b-}(B_{\beta(k+1)}\text{-co-}F_\zeta)_{n-3}\text{-b-}\ldots\text{-b-}(B_{\beta(k+x)}\text{-co-}W_\omega)_{n-p}$$ (I)

where:
"n" represents the number of blocks of the block copolymer;
"A" represents styrene and "B" represents methyl methacrylate, or conversely;
"C", "D", "E", "F", . . . , "W" respectively represent a co-monomer or mixture of co-monomers incorporated in each of the blocks of the block copolymer, the co-monomer or mixture of co-monomers incorporated in a styrene block differing from the co-monomer or mixture of co-monomers incorporated in a methyl methacrylate block;
the subscripts αi and βk represent the number of units of styrene or methyl methacrylate monomers contained in each block of the block copolymer, and are all independent of one another;
the subscripts γ, δ, ε, ζ, . . . , and ω represent the number of co-monomer units in a given block, and are all independent of one another;
the subscripts αi, βk, γ, δ, ε, ζ, . . . and ω are all greater than or equal to 1.

2. The block copolymer film according to claim 1, wherein said co-monomers or mixtures of co-monomers incorporated in each of the blocks are all chemically and/or structurally different from each other.

3. The block copolymer film according to claim 1, wherein the number n of blocks is less than or equal to 7.

4. The block copolymer film according to claim 1, wherein the subscripts αi, βk, γ, δ, ε, ζ, . . . , and ω further are less than or equal to 5000.

5. The block copolymer film according to claim 1, wherein the relative proportions in monomer units of each co-monomer or mixture of co-monomers incorporated in each block are between 1 and 99%, relative to the co-monomer with which it co-polymerises.

6. The block copolymer film according to claim 1, wherein the molecular weights of each block are between 500 and 200000 with a dispersity index less than or equal to 2.

7. The block copolymer film according to claim 1, wherein the volume fraction of each block relative to the total volume of the block copolymer varies from 5 to 95%.

8. The block copolymer film according to claim 1, wherein the co-monomers of each of the copolymer blocks have an arrangement of statistical or gradient type.

9. A process for nano-structuring a block copolymer film into nano-domains from a basic block copolymer non-structured at a determined temperature and having at least one block comprising styrene and at least one other block comprising methyl methacrylate according to claim 1, said process comprising the following steps:

synthesizing said block copolymer by incorporating at least one co-monomer in each of the blocks of said basic block copolymer applying a solution of said basic block copolymer in film form onto a surface, evaporating the solvent from the solution and annealing at said determined temperature.

10. The process according to claim 9, wherein synthesis is performed by controlled radical polymerisation.

11. The process according to claim 9, wherein synthesis is performed by anionic polymerisation.

12. The process according to claim 11, wherein the difference in pKa between the propagating species of a copolymer block to be synthesized and the incorporated co-monomer or mixture of co-monomers is less than or equal to 12.

13. The process according to claim 9, wherein the annealing step allows nano-structuring of the block copolymer film deposited on said surface and is conducted at a temperature T between 293 K and 673 K.

14. The process according to claim 9, wherein the anneal step allowing nano-structuring of the block copolymer film is conducted in a solvent atmosphere or via thermal route or a combination of both these methods.

15. The process according to claim 9, wherein at the time of the annealing step, the copolymer blocks self-organise into nano-domains with kinetics of 5 minutes or shorter.

16. The process according to claim 9, wherein the co-monomer or mixture of co-monomers incorporated in each of the copolymer blocks is incorporated with relative proportions in monomer units of between 1% and 99%, in relation to the co-monomer with which it co-polymerises to form a copolymer block.

17. The block copolymer film according to claim 1, wherein the number n of blocks is $2 \leq n \leq 3$.

18. The block copolymer film according to claim 1, wherein the relative proportions in monomer units of each co-monomer or mixture of co-monomers incorporated in each block are between 5 and 49%, relative to the co-monomer with which it co-polymerises.

19. The block copolymer film according to claim 1, wherein the molecular weights of each block are between 500 and 200000 with a dispersity index between 1.02 and 1.70.

* * * * *